United States Patent
Liu et al.

(10) Patent No.: US 10,645,807 B1
(45) Date of Patent: May 5, 2020

(54) COMPONENT ATTACH ON METAL WOVEN MESH

(71) Applicant: Flextronics AP, LLC, Broomfield, CO (US)

(72) Inventors: Weifeng Liu, Dublin, CA (US); Anwar Mohammed, San Jose, CA (US); Murad Kurwa, San Jose, CA (US)

(73) Assignee: Flextronics AP, LLC., Broomfield, CO (US)

( * ) Notice: Subject to any disclaimer, the term of this patent is extended or adjusted under 35 U.S.C. 154(b) by 241 days.

(21) Appl. No.: 14/469,150

(22) Filed: Aug. 26, 2014

Related U.S. Application Data

(60) Provisional application No. 61/870,582, filed on Aug. 27, 2013.

(51) Int. Cl.
 *H05K 1/03* (2006.01)
 *H05K 3/34* (2006.01)
 *H05K 1/18* (2006.01)

(52) U.S. Cl.
 CPC .......... *H05K 1/038* (2013.01); *H05K 1/0393* (2013.01); *H05K 1/181* (2013.01); *H05K 3/34* (2013.01); *Y10T 29/49169* (2015.01)

(58) Field of Classification Search
 CPC .... H05K 1/038; H05K 1/0393; H05K 1/0366; H05K 1/0353; H05K 1/181; H05K 3/34; Y10T 29/49169; Y10T 29/49124; Y10T 29/4913; Y10T 29/49117; Y10T 29/49002
 USPC ............... 29/854, 825, 592.1, 829, 832, 846
 See application file for complete search history.

(56) References Cited

U.S. PATENT DOCUMENTS

| | | |
|---|---|---|
| 3,671,726 A | 6/1972 | Kerr |
| 4,069,497 A | 1/1978 | Steidlitz |
| 4,338,149 A | 7/1982 | Quaschner |
| 4,712,160 A | 12/1987 | Sato et al. |
| 4,774,530 A | 9/1988 | Hawkins |
| 4,899,256 A | 2/1990 | Sway-Tin |
| 5,101,322 A | 3/1992 | Ghaem et al. |
| 5,116,440 A | 5/1992 | Takeguchi |
| 5,121,297 A | 6/1992 | Haas |
| 5,175,047 A | 12/1992 | McKenney |
| 5,206,463 A | 4/1993 | DeMaso |
| 5,235,491 A | 8/1993 | Weiss |
| 5,272,599 A | 12/1993 | Koenen |

(Continued)

FOREIGN PATENT DOCUMENTS

| | | |
|---|---|---|
| CN | 108020164 | 10/2016 |
| JP | 2008078454 A | 4/2008 |

(Continued)

OTHER PUBLICATIONS

Understanding the Influence of Copper Nanoparticles on Thermal Characteristics and Microstructural Development of a Tin-Silver Solder, D.C. Lin, T.S. Srivatsan, G-X Wang, and R. Kovacevic (Submitted Jan. 12, 2006; in revised form Oct. 10, 2006).

(Continued)

*Primary Examiner* — A. Dexter Tugbang
*Assistant Examiner* — Azm A Parvez
(74) *Attorney, Agent, or Firm* — Haverstock & Owens LLP

(57) ABSTRACT

Methods of and devices for coupling metal woven mesh or metal woven fabric with IC components to make flexible circuits are disclosed. The flexible circuits can be used to make wearable electronic devices, such as a garment with embedded IC chip.

5 Claims, 12 Drawing Sheets

(56) References Cited

U.S. PATENT DOCUMENTS

| | | |
|---|---|---|
| 5,291,374 A | 3/1994 | Hirata |
| 5,295,044 A | 3/1994 | Araki et al. |
| 5,365,403 A | 11/1994 | Vinciarelli et al. |
| 5,536,677 A | 7/1996 | Hutbacher |
| 5,739,254 A | 4/1998 | Fuller |
| 5,739,586 A | 4/1998 | Cannizzaro et al. |
| 5,761,809 A | 6/1998 | Fuller |
| 5,762,812 A | 6/1998 | Narang |
| 5,838,554 A | 11/1998 | Lanni |
| 5,849,809 A | 12/1998 | Narang |
| 5,863,963 A | 1/1999 | Narang |
| 5,872,051 A | 2/1999 | Fallon et al. |
| 5,873,512 A | 2/1999 | Bielick et al. |
| 5,920,458 A | 7/1999 | Azar |
| 5,933,324 A | 8/1999 | Barrett |
| 5,945,253 A | 8/1999 | Narang |
| 5,958,995 A | 9/1999 | Narang |
| 5,994,425 A | 11/1999 | Narang |
| 6,007,877 A | 12/1999 | Narang |
| 6,035,524 A | 3/2000 | Suppa |
| 6,124,372 A | 9/2000 | Smith |
| 6,139,920 A | 10/2000 | Smith |
| 6,189,771 B1 | 2/2001 | Maeda et al. |
| 6,243,269 B1 | 6/2001 | Dibene, II et al. |
| 6,245,595 B1 | 6/2001 | Nguyen |
| 6,260,956 B1 | 7/2001 | Narang |
| 6,272,015 B1 | 8/2001 | Mangtani |
| 6,282,092 B1 | 8/2001 | Okamoto et al. |
| 6,302,523 B1 | 10/2001 | Smith |
| 6,311,139 B1 | 10/2001 | Kuroda et al. |
| 6,369,328 B1 | 4/2002 | Munakata |
| 6,400,573 B1 | 6/2002 | Mowatt |
| 6,477,054 B1 | 11/2002 | Hagerup |
| 6,541,712 B1 | 4/2003 | Gately |
| 6,549,409 B1 | 4/2003 | Saxelby et al. |
| 6,775,162 B2 | 8/2004 | Mihai et al. |
| 6,795,315 B1 | 9/2004 | Wu et al. |
| 6,891,272 B1 | 6/2005 | Fjelstad |
| 7,208,833 B2 | 4/2007 | Nobori et al. |
| 7,269,017 B2 | 9/2007 | Berlin |
| 7,676,775 B2 | 3/2010 | Chen et al. |
| 8,222,537 B2 | 7/2012 | Dudnikov, Jr. |
| 8,302,301 B2 | 11/2012 | Lau |
| 8,330,051 B2 | 12/2012 | Huang |
| 8,519,270 B2 | 8/2013 | Chang |
| 8,707,221 B2 | 4/2014 | Durken |
| 8,918,991 B2 | 12/2014 | Ao |
| 9,035,197 B2 | 5/2015 | Ao |
| 9,338,899 B2 | 5/2016 | Lee |
| 9,480,141 B1 | 10/2016 | Harnadeh |
| 9,763,327 B2 | 9/2017 | Pen et al. |
| 9,867,290 B2 | 1/2018 | Pen et al. |
| 2001/0003427 A1 | 6/2001 | Ferguson et al. |
| 2001/0018263 A1 | 8/2001 | Ochiai et al. |
| 2001/0045297 A1 | 11/2001 | Miller et al. |
| 2001/0055069 A1 | 12/2001 | Hudson |
| 2002/0008963 A1 | 1/2002 | DiBene, II et al. |
| 2002/0018042 A1 | 2/2002 | Albert |
| 2002/0092160 A1 | 7/2002 | McCullough |
| 2003/0110610 A1 | 6/2003 | Duquette |
| 2003/0170553 A1 | 9/2003 | Eberlein |
| 2003/0227079 A1 | 12/2003 | Chia |
| 2004/0000425 A1 | 1/2004 | White |
| 2004/0122606 A1 | 6/2004 | Cohen et al. |
| 2004/0144527 A1 | 7/2004 | Yang et al. |
| 2004/0256725 A1 | 12/2004 | Inoue |
| 2005/0246590 A1 | 11/2005 | Lancaster |
| 2006/0043567 A1 | 3/2006 | Palanduz |
| 2006/0131440 A1 | 6/2006 | Yen |
| 2006/0132427 A1* | 6/2006 | Weisberg ............. G02F 1/167 345/107 |
| 2006/0196642 A1 | 9/2006 | Gharib |
| 2006/0254811 A1* | 11/2006 | Kirstein ............. H05K 1/038 174/256 |
| 2007/0077682 A1 | 4/2007 | Cerio, Jr. |
| 2007/0096260 A1 | 5/2007 | Eshun |
| 2007/0117261 A1 | 5/2007 | Ueno |
| 2007/0137891 A1 | 6/2007 | Fan |
| 2007/0137991 A1 | 6/2007 | Fan |
| 2007/0198548 A1 | 8/2007 | Lee |
| 2007/0221404 A1 | 9/2007 | Das |
| 2007/0272435 A1 | 11/2007 | Johnson |
| 2007/0273011 A1 | 11/2007 | Singleton et al. |
| 2008/0070011 A1 | 3/2008 | Oh, II |
| 2008/0186682 A1 | 8/2008 | Sugimura |
| 2008/0217708 A1 | 9/2008 | Reisner |
| 2008/0217768 A1 | 9/2008 | Miranda et al. |
| 2008/0224026 A1 | 11/2008 | Pasternek |
| 2008/0282540 A1 | 11/2008 | Singleton |
| 2008/0301597 A1 | 12/2008 | Chen et al. |
| 2009/0004438 A1 | 1/2009 | Urakawa |
| 2009/0014501 A1 | 1/2009 | Nishi et al. |
| 2009/0083975 A1 | 4/2009 | Lee |
| 2009/0108270 A1 | 4/2009 | Chen |
| 2009/0220738 A1 | 9/2009 | Oka |
| 2009/0257166 A1 | 10/2009 | Kim |
| 2009/0265155 A1 | 10/2009 | Yokogawa |
| 2009/0301606 A1 | 12/2009 | Ueshima |
| 2010/0000762 A1 | 1/2010 | Yang |
| 2010/0014265 A1 | 1/2010 | Sagisaka |
| 2011/0067904 A1 | 3/2011 | Aoyoma |
| 2011/0135248 A1 | 6/2011 | Langer |
| 2011/0180306 A1 | 7/2011 | Naganuma |
| 2011/0180307 A1 | 7/2011 | Naganuma |
| 2011/0194262 A1 | 8/2011 | Naganuma |
| 2011/0198111 A1 | 8/2011 | Naganuma |
| 2011/0199739 A1 | 8/2011 | Naganuma |
| 2011/0203837 A1 | 8/2011 | Naganuma |
| 2011/0225816 A1 | 9/2011 | Chou |
| 2011/0290540 A1 | 12/2011 | Jung |
| 2011/0307752 A1 | 12/2011 | Fujil et al. |
| 2012/0024575 A1 | 2/2012 | Zhang |
| 2012/0063096 A1 | 3/2012 | Kearney |
| 2012/0104591 A1 | 5/2012 | Warren |
| 2012/0181074 A1 | 7/2012 | Ishihara |
| 2012/0234587 A1 | 9/2012 | Nakamura |
| 2013/0038545 A1 | 2/2013 | Hsu |
| 2013/0074331 A1* | 3/2013 | Brun ............. H01L 23/4985 29/832 |
| 2013/0209672 A1 | 8/2013 | Reinmuth |
| 2013/0216699 A1 | 8/2013 | Yamaguchi |
| 2014/0262455 A1 | 9/2014 | Iketani |
| 2014/0301053 A1 | 10/2014 | Iida |
| 2015/0187863 A1 | 7/2015 | Zhu |
| 2015/0257278 A1 | 9/2015 | Niskala |
| 2015/0261057 A1 | 9/2015 | Harris |
| 2015/0376444 A1 | 12/2015 | Saito |
| 2016/0021762 A1 | 1/2016 | Kallman |
| 2016/0088729 A1 | 3/2016 | Kobuke |
| 2017/0108459 A1 | 4/2017 | Katsuki |
| 2017/0150602 A1 | 5/2017 | Johnston |
| 2018/0020563 A1 | 1/2018 | Hong |

FOREIGN PATENT DOCUMENTS

| | | |
|---|---|---|
| JP | 2015012022 A | 1/2015 |
| KR | 10-0887133 B1 | 3/2009 |
| KR | 10-0891814 B1 | 4/2009 |
| KR | 100891814 B1 | 4/2009 |

OTHER PUBLICATIONS

A Reliability Study of Nanoparticles Reinforced Composite Lead-Free Solder, Si Chen1, Lili Zhang1, Johan Liu1 (Accepted May 19, 2010; Published Sep. 25, 2010).

Recent Development.

Non-final office action dated Aug. 11, 2016, U.S. Appl. No. 14/476,549, filed Sep. 3, 2014, 9 pages.

Non-Final Office Action dated Oct. 31, 2016, U.S. Appl. No. 14/834,180, filed Aug. 24, 2015, applicant; Kwan Pen, 19 pages.

Non-Final Office Action dated Nov. 1, 2016; U.S. Appl. No. 14/834,205, filed Aug. 24, 2015, applicant; Kwan Pen, 22 pages.

(56) References Cited

OTHER PUBLICATIONS

Non-Final Office Action, dated Feb. 27, 2018, U.S. Appl. No. 15/087,793, filed Mar. 31, 2016, Applicant: Pui Yin Yu, 11 pages.
Notice of Allowance dated Jun. 13, 2018, U.S. Appl. No. 15/094,372, filed Apr. 8, 2016, Applicant: Kwan Pen, 14 pages.
Non-Final Office Action, dated May 1, 2018, U.S. Appl. No. 15/159,665, filed May 19, 2016, Applicant: Jiawen Chen, 8 pages.
Non-final office action dated Jun. 26, 2019, U.S. Appl. No. 14/536,370, filed Nov. 7, 2014, Applicant: Josef Kaiser, 9 pages.

* cited by examiner

COMPONENT ATTACH ON METAL WOVEN MESH

CROSS-REFERENCE TO RELATED APPLICATION(S)

This application claims priority under 35 U.S.C. § 119(e) of the U.S. Provisional Patent Application Ser. No. 61/870,582, filed Aug. 27, 2013 and titled, "3D PRINTING WITH COMPONENTS EMBEDDED," which is also hereby incorporated by reference in its entirety for all purposes.

FIELD OF THE INVENTION

The present invention relates to flexible and wearable electronics. More specifically, the present invention relates to component attachment to the metal woven mesh.

BACKGROUND OF THE INVENTION

Conventional methods of making flexible electronics rely on typical PCB fabrication processes or printing conductive ink to form interconnection on a flexible substrate. Typical PCB fabrication processes are complicated, have limited layer capability, and have limitation in the flexibility (such as a large bending radius, very limited maximum bending number). Similarly, the process of printing conductive ink to form interconnection on flexible substrates has many limitations, such as (1) limited current carrying capability, (2) not ideal for direct chip bonding, (3) not reliable, and (4) not a mature industrial process.

SUMMARY OF THE INVENTION

Methods of and devices for using metal woven mesh or metal woven fabric to make flexible circuits are disclosed. The methods include making components that can attach on metal woven mesh. An assembly process and structures allowing mounting electronic component to woven mesh are provided. Further, the methods and devices are suitable for high volume production, are cost effective, and able to be used for rapid prototyping.

In an aspect of the invention, a method of coupling an IC component with a conductive mesh comprises exposing one or more conductive wires of a mesh and coupling the IC component with the one or more conductive wires. In some embodiments, the mesh comprises a metal woven fabric. In other embodiments, the coupling comprises soldering the one or more conductive wires with an input-output terminal of the IC component. In some other embodiments, the method further comprises determining an area to be cut on the conductive mesh according to a footprint of the input-output terminals of the IC component. In some embodiments, the method further comprises cutting the area. In some other embodiments, the method further comprises stripping a portion of an insulating material from the one or more conductive wires of the mesh.

In another aspect, a wearable device comprises a conductive material woven fabric, an IC component, and one or more exposed conductive material of the conductive material woven fabric electrically coupling with the IC component. In some embodiments, the conductive material woven fabric comprises an insulating material coating a conducting wire. In other embodiments, the insulating material comprises a polymer. In some other embodiments, the polymer comprises polyamide, polyimide, silicone, or a combination thereof. In some embodiments, the conducting wire comprises a metal wire. In other embodiments, the device further comprises a cut-out window having a dimension similar to the size of the IC component. In some other embodiments, the device further comprises a plated metal on the one or more exposed conductive material.

In another aspect, a method of coupling an IC component with a conducting mesh comprises stripping a first predetermined area of an insulating material, wherein the area is determined based on a size of an IC component, cutting a second predetermined area of conducting wires, wherein the second predetermined area is smaller than the first predetermined area, thereby forming one or more strips of exposed conducting wires, and coupling the exposed conducting wires to input-output terminals of the IC component. In some embodiments, the coupling comprising soldering. In other embodiments, the insulating material comprises a polymer. In some other embodiments, each of the input-output terminals matches with an exposed conducting wires.

In another aspect, a multiple layer wearable mesh device comprises a first layer of a conductive wire woven mesh coupling with a first set of input-output terminals of an IC component and a second layer of the conductive wire woven mesh coupling with a second set of the input-output terminals of the IC component. In some embodiments, each of the first layer of a conductive wire woven mesh and the second layer of the conductive wire woven mesh comprise a cut-out window similar in size of the IC component. In other embodiments, the first layer of a conductive wire woven mesh and the second layer of the conductive wire woven mesh are part of a garment.

Other features and advantages of the present invention will become apparent after reviewing the detailed description of the embodiments set forth below.

BRIEF DESCRIPTION OF THE DRAWINGS

Embodiments will now be described by way of examples, with reference to the accompanying drawings which are meant to be exemplary and not limiting. For all figures mentioned herein, like numbered elements refer to like elements throughout.

DETAILED DESCRIPTION OF THE PREFERRED EMBODIMENT

Reference is made in detail to the embodiments of the present invention, examples of which are illustrated in the accompanying drawings. While the invention is described in conjunction with the embodiments below, it is understood that they are not intended to limit the invention to these embodiments and examples. On the contrary, the invention is intended to cover alternatives, modifications and equivalents, which can be included within the spirit and scope of the invention as defined by the appended claims. Furthermore, in the following detailed description of the present invention, numerous specific details are set forth in order to more fully illustrate the present invention. However, it is apparent to one of ordinary skill in the prior art having the benefit of this disclosure that the present invention can be practiced without these specific details. In other instances, well-known methods and procedures, components and processes have not been described in detail so as not to unnecessarily obscure aspects of the present invention. It is, of course, appreciated that in the development of any such actual implementation, numerous implementation-specific decisions must be made in order to achieve the developer's specific goals, such as compliance with application and business related constraints, and that these specific goals are vary from one implementation to another and from one developer to another. Moreover, it is appreciated that such a development effort can be complex and time-consuming, but is nevertheless a routine undertaking of engineering for those of ordinary skill in the art having the benefit of this disclosure.

Figure 1:
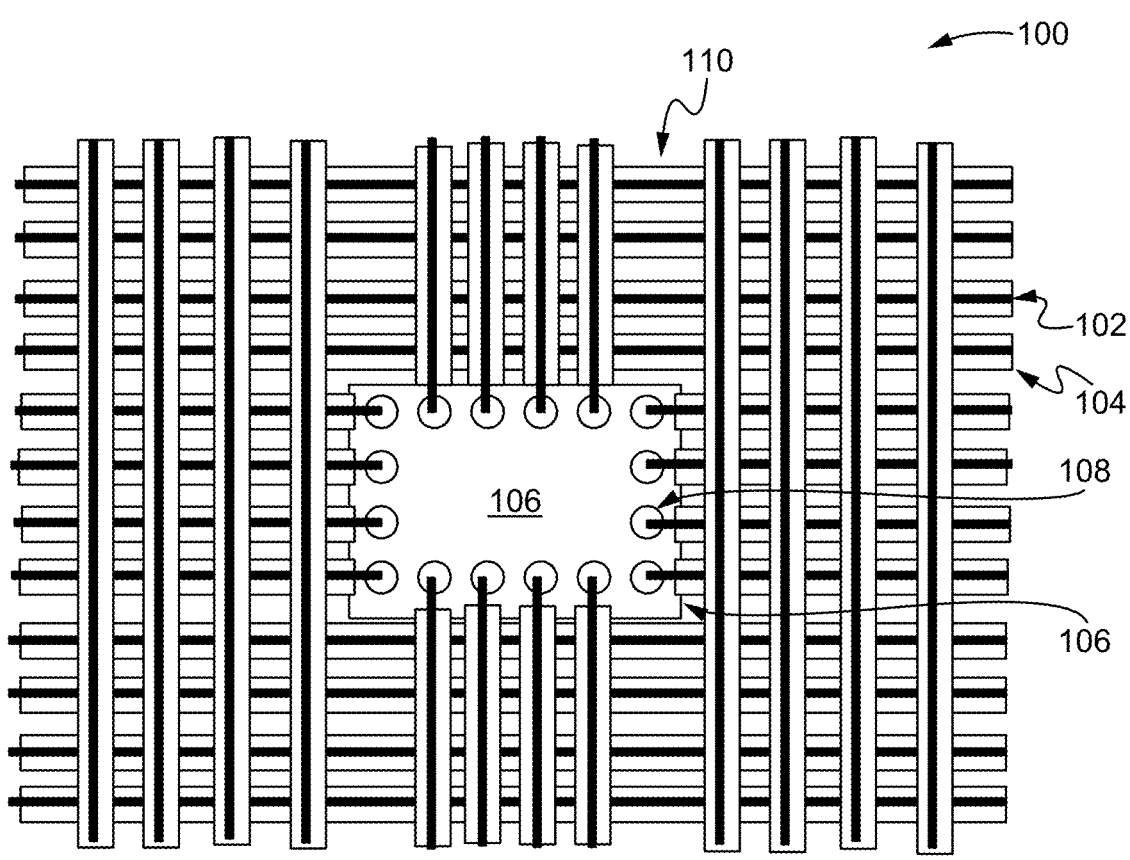
FIG. 1 illustrates a structure of an electronic component attached on metal woven mesh in accordance with some embodiments of the present invention.
Figure 2A:
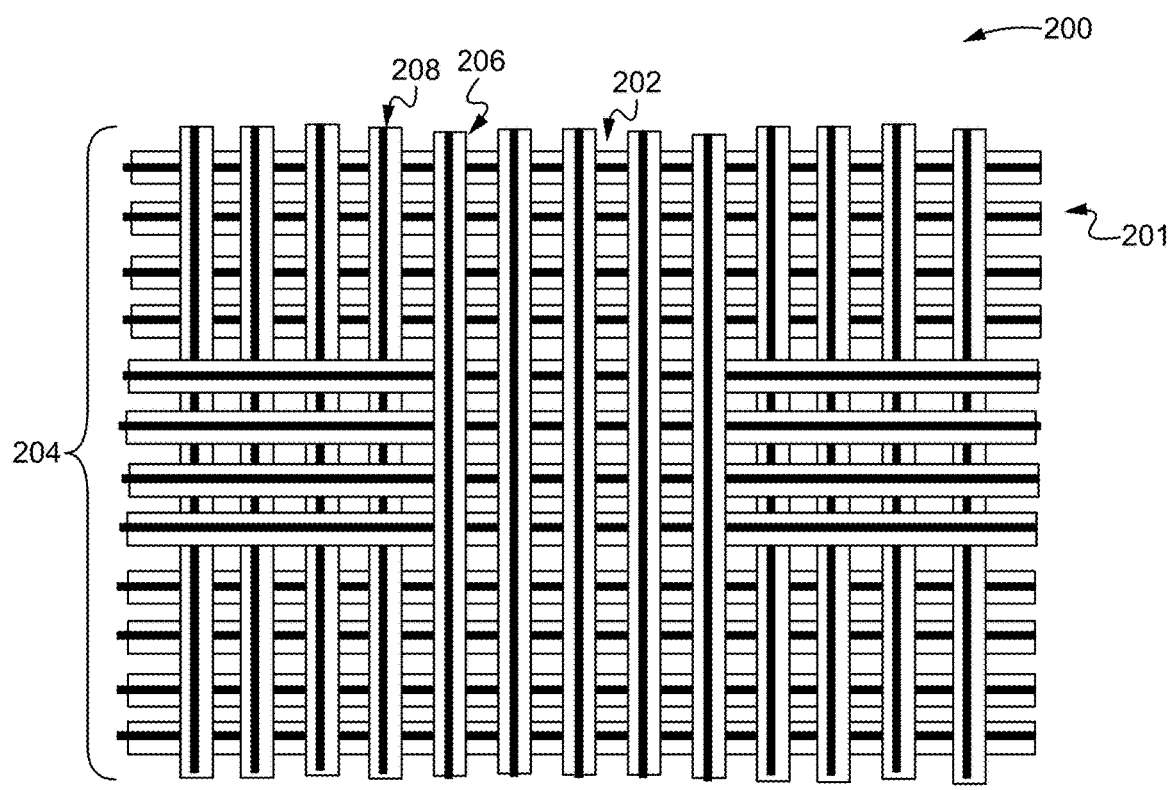
FIGS. 2A-2F illustrate a method of making a component attached on a conductive mesh in accordance with some embodiments of the present invention.
Figure 2B:
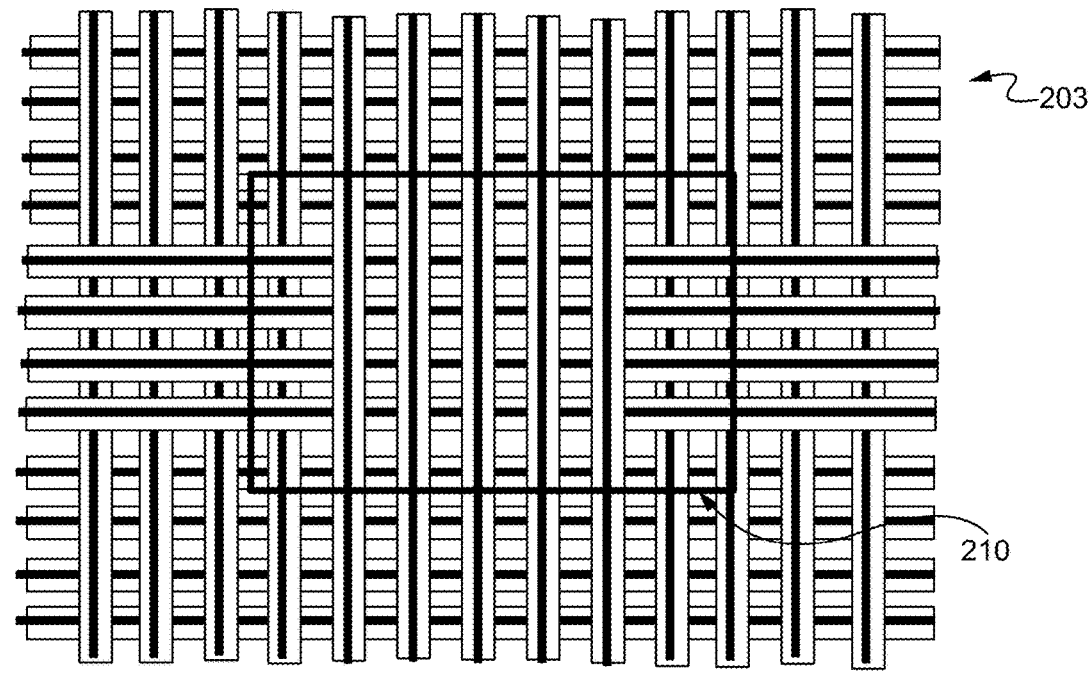
Figure 2C:
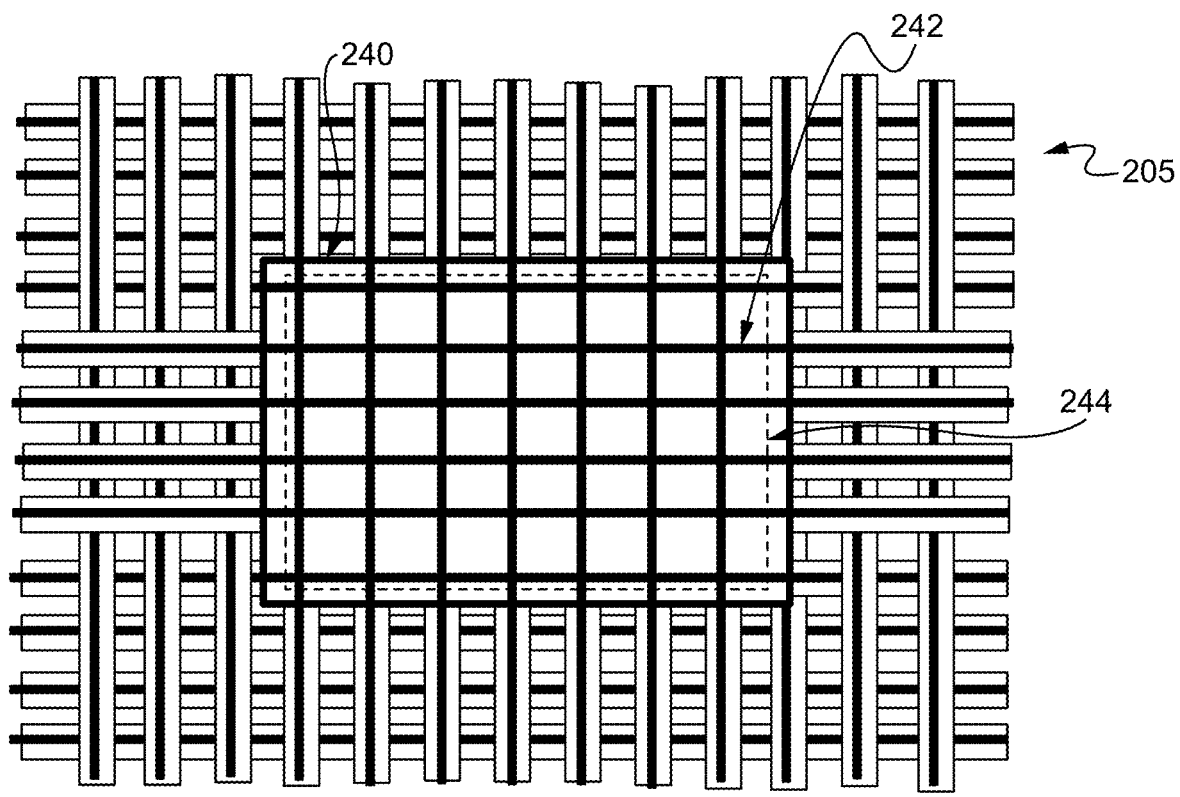
Figure 2D:
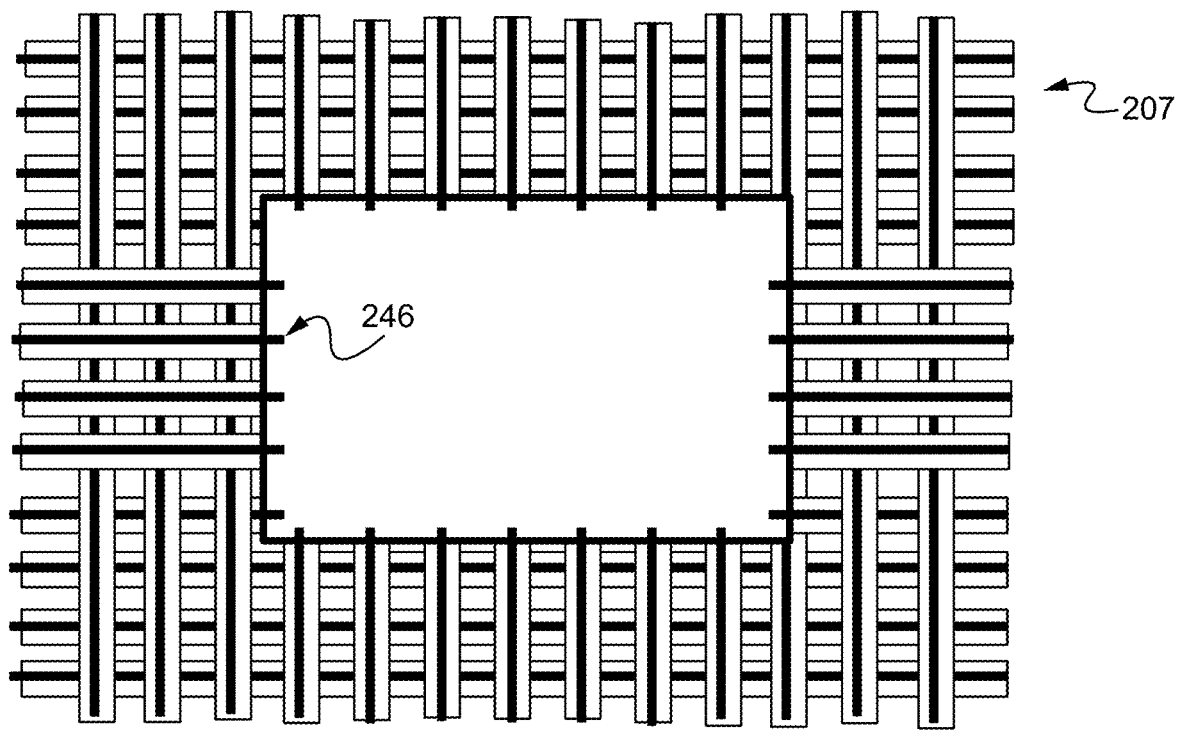
Figure 2E:
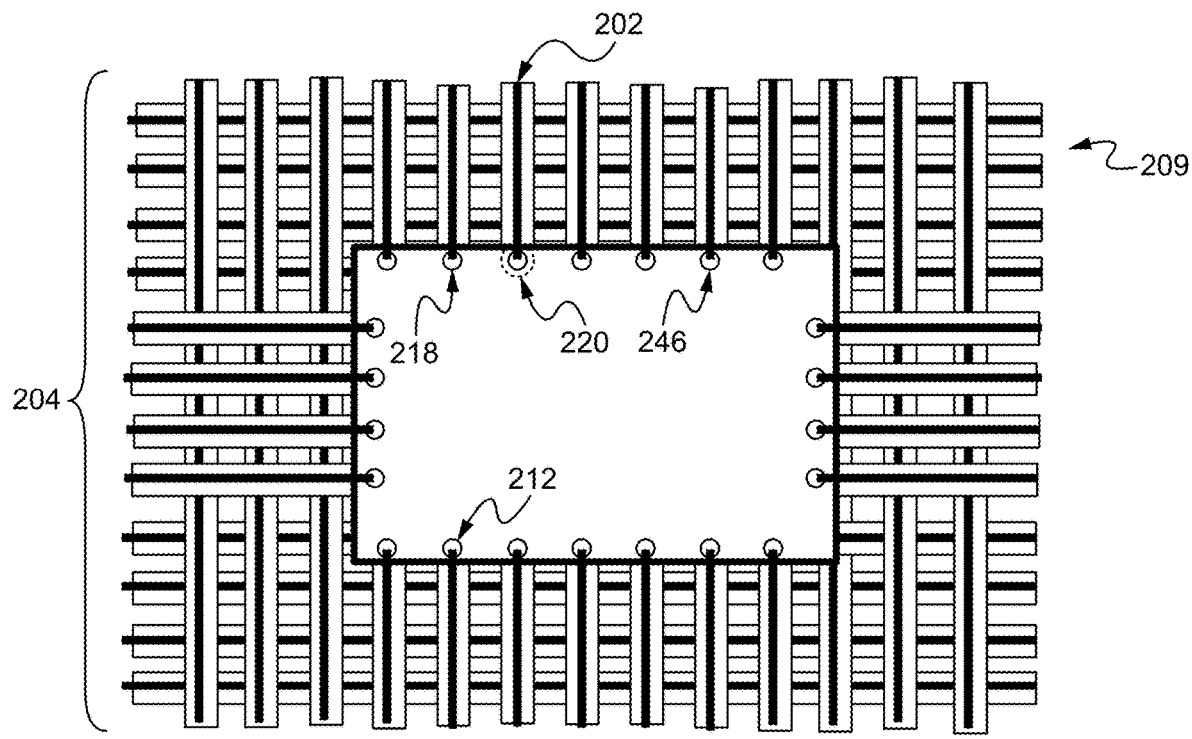
Figure 2F:
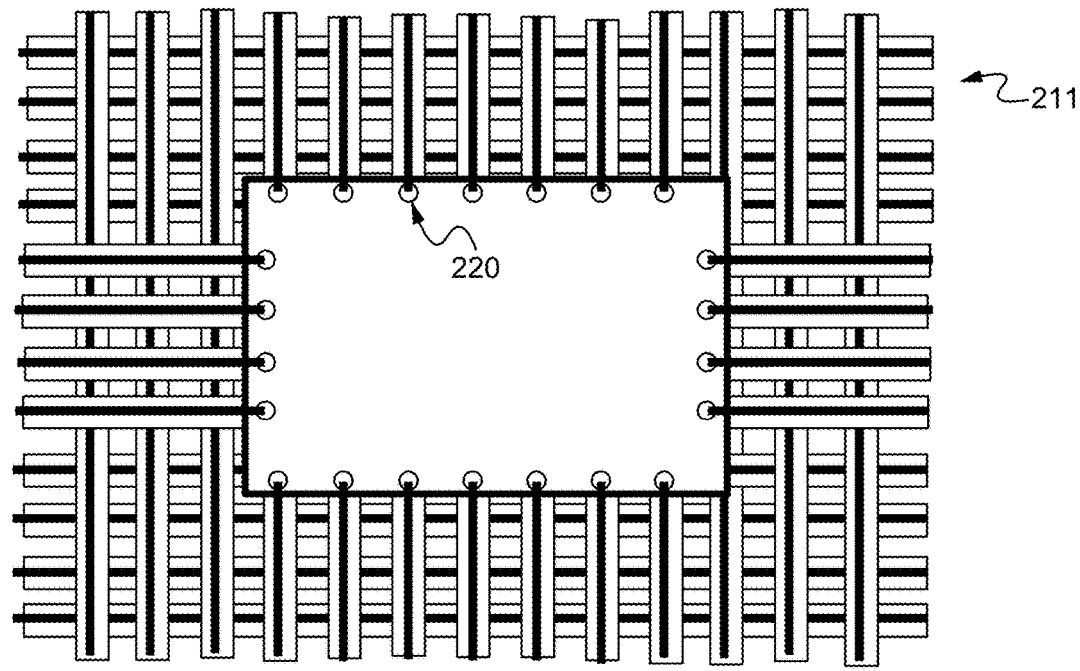

FIG. 1 illustrates a structure 100 of an electronic component attached on metal woven mesh in accordance with some embodiments of the present invention. The structure 100 can be formed by having metal wires 102 coated with polymer insulator 104 woven into a mesh 110. One or more electronic components 106 can be attached on the metal woven mash 110. The structure 100 is able to be used in wearable electronics, printable electronics, flexible electronics, or a combination thereof. The attachment of the electronic components 106 can be achieved by using thermocompression wire bonding, thermosonic bonding, ultrasonic bonding, soldering, electrically conductive adhesives, and a combination thereof. The electronic components can be bare silicon with I/O (input/output) pads 108 on the bottom of the terminals. The I/O pads 108 can be plated with nickel/gold or copper column, copper pillar with solder cap, gold stud bump, or solder balls (bumps). The I/O pad 108 can also be deposited with conductive adhesives, solder through screening printing before the attaching process.

In some embodiments, the electronic components 106 comprises electronic packages, including BGA (ball grid array), CSP (chip scale package), or LGA (land grid array package). Based on the different packaging types, the electronic components 106 can be attached through soldering, adhesive, or a combination thereof. In some other embodiments, the electronic components 106 can comprise capacitors, resistors, or one or more integrated circuit chips that can be used in any electronic devices.

In some embodiments, the metal wires 102 are coated with insulators, such as silicone polymer, to prevent shorting among the metal wires 102. In other embodiments, the metal wires 102 are embedded in the woven insulator mesh, such as cloth, polymer, and fiber. A person of ordinary skill in the art appreciates that any insulator can be used to coat or wrap the metal wires 102. In some embodiments, the metal wires 102 are in a circular form, a ribbon form or a ribbon of multiple conductives.

FIGS. 2A-2F illustrate a method of making a component attached on a conductive mesh in accordance with some embodiments of the present invention. At a step 201, one or more conductive wires 202 are used to make a woven mesh 204. The woven mesh 204 has conductive wires crossing over and under each other forming a web mesh structure. The conductive wires 204 can be coated, wrapped, and covered by an insulator 206 entirely or partially. The conductive portion 208 of the conductive wires 202 can comprise copper, nickel, gold, silver, pure metal or alloy, substance with plating or without plating. The plating material can be nickel/gold, silver, palladium, OSP (organic solderable preservative), solder (tin lead or lead free), or a combination thereof. Based on the needs, such as electric current and pitch, the wire diameter can be from less than 1 mm to larger than 10 mm. In some embodiments, the wire diameter is between 1 mm to 9 mm. In some embodiments, the pitch or the distance between the conductive wires 202 is between 1 micron to 1 mm. A person of ordinary skill in the art appreciates that the sizes of the wire diameters and the pitch can be in any scale.

In some embodiments, the mesh can be woven purely through coated metal wires or through mixed metal wires and insulator (polymer) wires. In some embodiments, the conductive wires 202 are woven into cloth, which becomes part of the clothing. In some embodiments, the coating 206 (the insulating part wrapping the conductive portion of the conductive wires 202) can be polyamide, polyimide, or any other insulating materials, such as silicone and polymeric materials.

At a step 203 (FIG. 2B), a predetermined area 210 is labeled for further processing. The labeling can be done by using a silk printing. A person of ordinary skill in the art appreciates that any other methods are able to be used to label the predetermined area 210 so long as a distinguishable marking is able to be made. At a step 205, the predetermined area 210 of the insulator 206 is stripped forming an area 240 (FIG. 2C) with exposed conductive portion 242 of the conductive wires 202. In some embodiments, UV or laser is used to trip the insulator 206.

At a step 207 (FIG. 2D), wires 244 are cut and removed along a pre-determined wire-cut area 244 (FIG. 2C) leaving one or more exposed conductive portions 246. The cutting of the wires is able to be performed by using a laser or any other cutting instruments.

At a step 209 (FIG. 2E), silicon die 218 is attached to the one or more exposed conductive portions 246 forming metal pads 220. The metal pads can be I/O pads. In some embodiments, the mesh 204 are aligned using an alignment process, such that each of the conductive wires 202 is touching/coupling corresponding silicon dies 218. Extra wires can be left for redundancy preventing the wires from insufficient length that can cause bad contact points.

At step 211 (FIG. 2F), the exposed conductive portion 246 is welded to the silicon die 218 forming the welded metal pads 220. In some embodiments, a laser is used in the welding process. In some other embodiments, thermosonic, ultrasonic, thermo-compression, or a combination thereof is used for the welding. In some embodiments, non-conductive film or paste are applied to encapsulate/cover the silicon area to protect the interconnections, such as the exposed conductive portion 208, the silicon die 218, and/or the metal pads 220. The non-conductive film or paste can be cured at a high temperature, such as 150° C., for extended hours (such as 1 hour or longer).

Figure 3A:
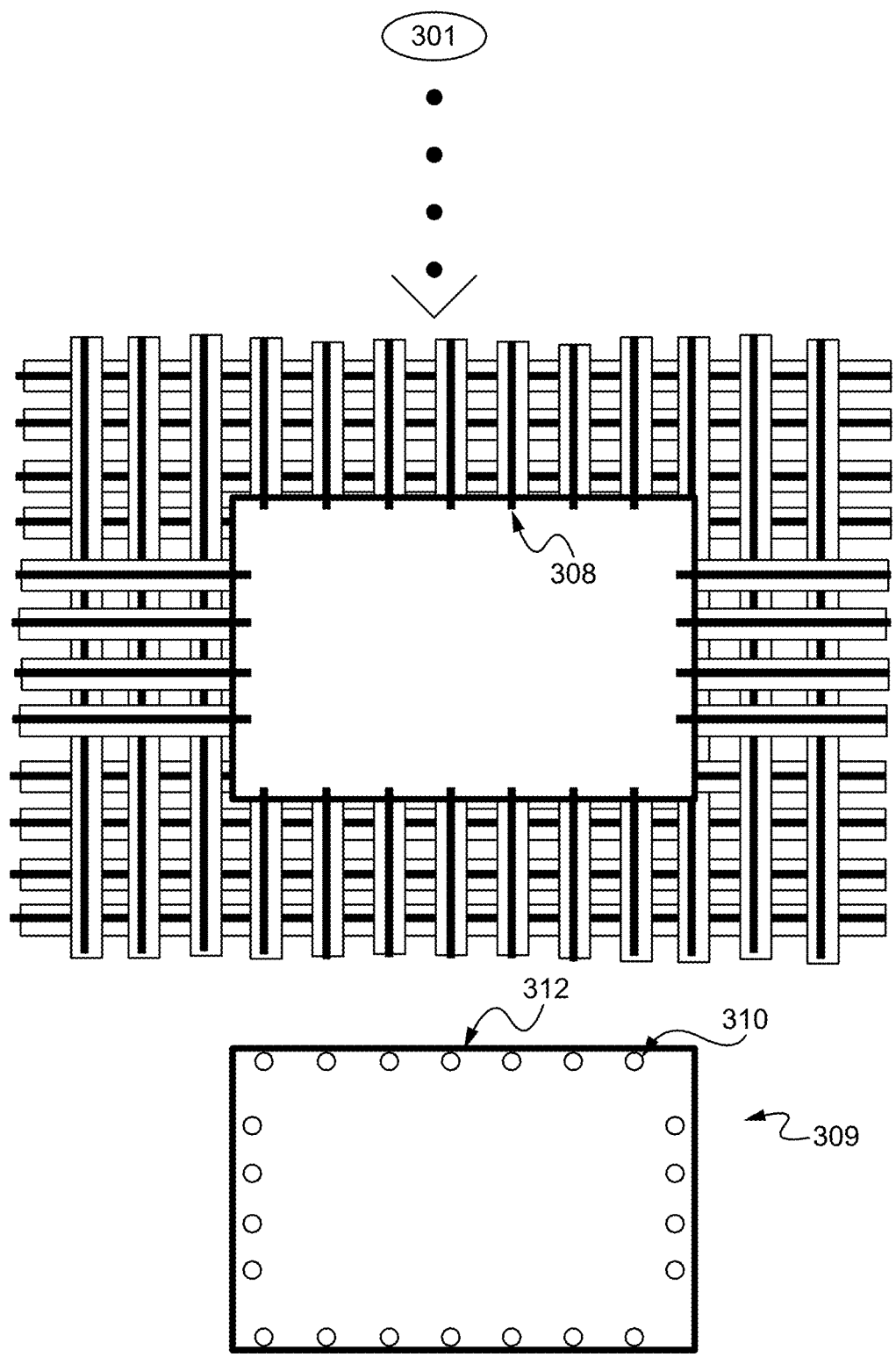
FIGS. 3A and 3B illustrate another method of making a component attached on a conductive mesh in accordance with some embodiments of the present invention.
Figure 3B:
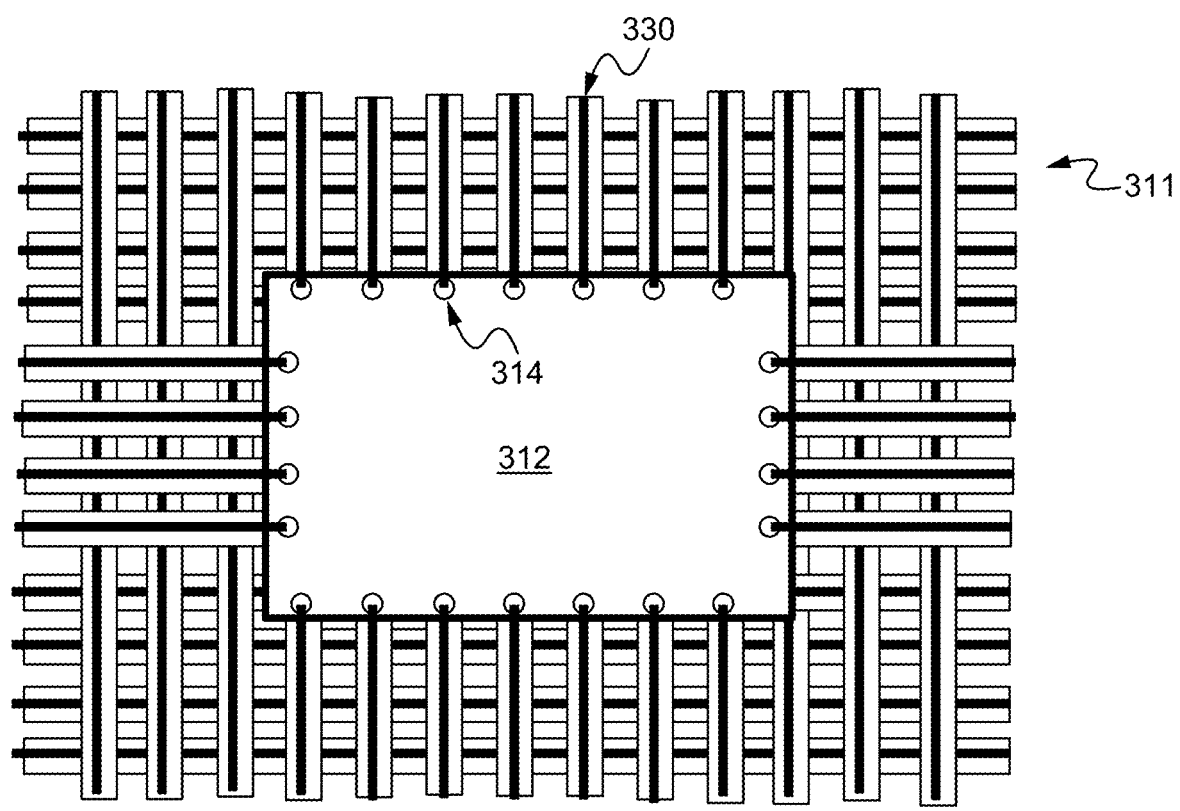

FIG. 3 illustrates another method 300 of making a component attached on a conductive mesh in accordance with some embodiments of the present invention. The first part of the process (Steps 301, 303, 305, and 307) can be the same as described in the Steps 201, 203, 205, and 207 of the method 200 in FIG. 2. At Step 309 (FIG. 3A), after forming the one or more exposed conductive portions 308, solder paste 310 (e.g., tin lead or lead free) is printed on the silicon pad 312. At Step 311, a mesh 330 is attached to the silicon pad 312. Reflow is performed to solder the mesh wire 314 to the silicon pad 312. A non-conductive polymer adhesives, such as epoxy, is coated to protect the silicone pad 312 and the wires 314 on the mesh 330.

FIGS. 4A-4D illustrate another method 400 of making a wearable device in accordance with some embodiments of the present invention. The method 400 can start from Step 401. Metal wires 404 or ribbons are coated with insulator 406 (e.g., polymer) to make a woven mesh 402. The insulator 406 can be polyamide and polyimide. A person of ordinary skill in the art appreciates that any other polymerical materials are able to be used so long as it can used to coat the meal wires. The wires 404 can be copper, nickle, gold, silver, or alloys of the metals thereof. In some embodiments, the wires comprise pure metal without further plating. In some other embodiments, the wires comprise metals with plating. The substances that can be used as a plating material comprising nickle/gold, silver, palladium, osp (organic solderable preservative), and solder (such as, tin lead or lead free).

In some embodiments, the diameter of the wires 404 is less than 1 mm. In other embodiments, the diameter of the wires 404 is in the range of 1-10 mm. A person of ordinary skill in the art appreciates that the diameter of the wires can be in any sizes that can be determined by its uses, such as clothes and curtains. The sizes of the component pitch can be from micron level to above 1mm. In some embodiments, the mesh 402 is woven purely through coated metal wire. In other embodiments, the mesh 402 is woven by a mixed metal wires or insulator wires having polymer coated metal wires.

At Step 403 (FIG. 4B), predetermined areas 410 of the coated polymer of the mesh 402 are stripped or partially stripped using UV or laser. The areas 410 can be determined based on the silicon/package footprint 408. The areas 410 of the metal wires are exposed forming exposed metal wires 412.

Figure 4A:
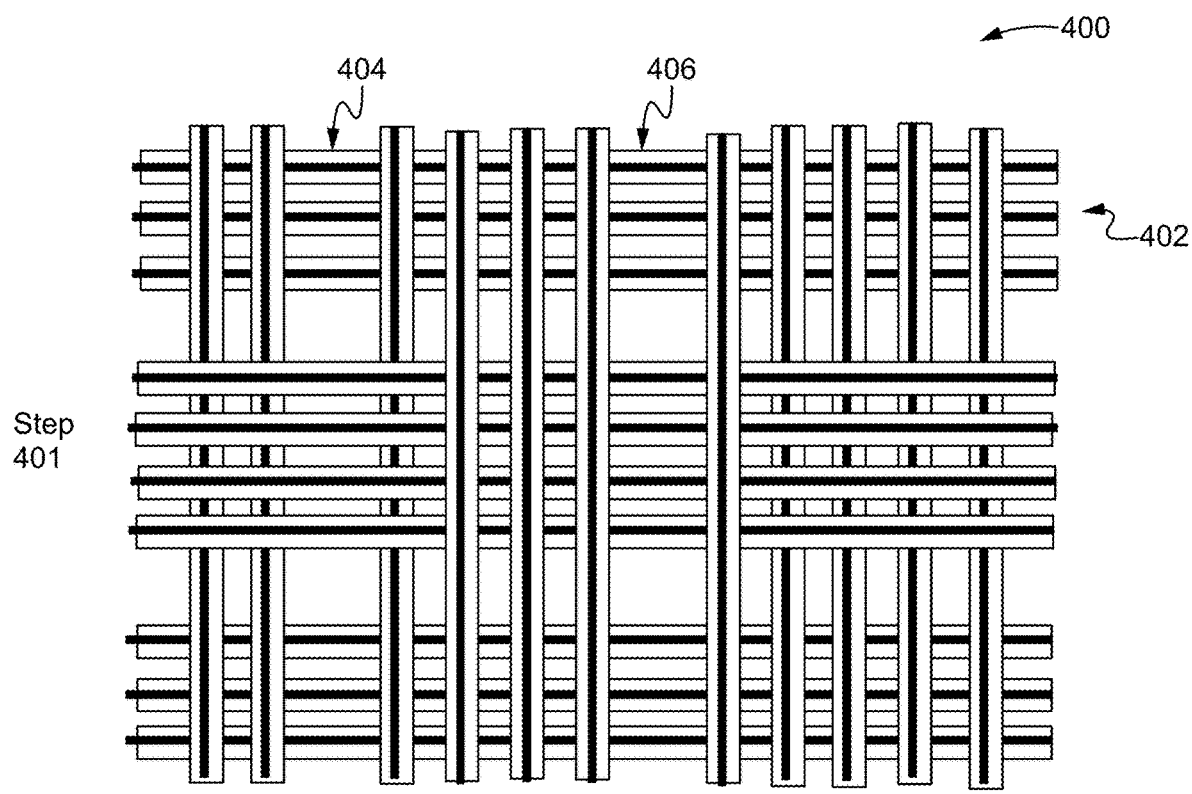
FIGS. 4A-4D illustrates another method of making a wearable device in accordance with some embodiments of the present invention.
Figure 4B:
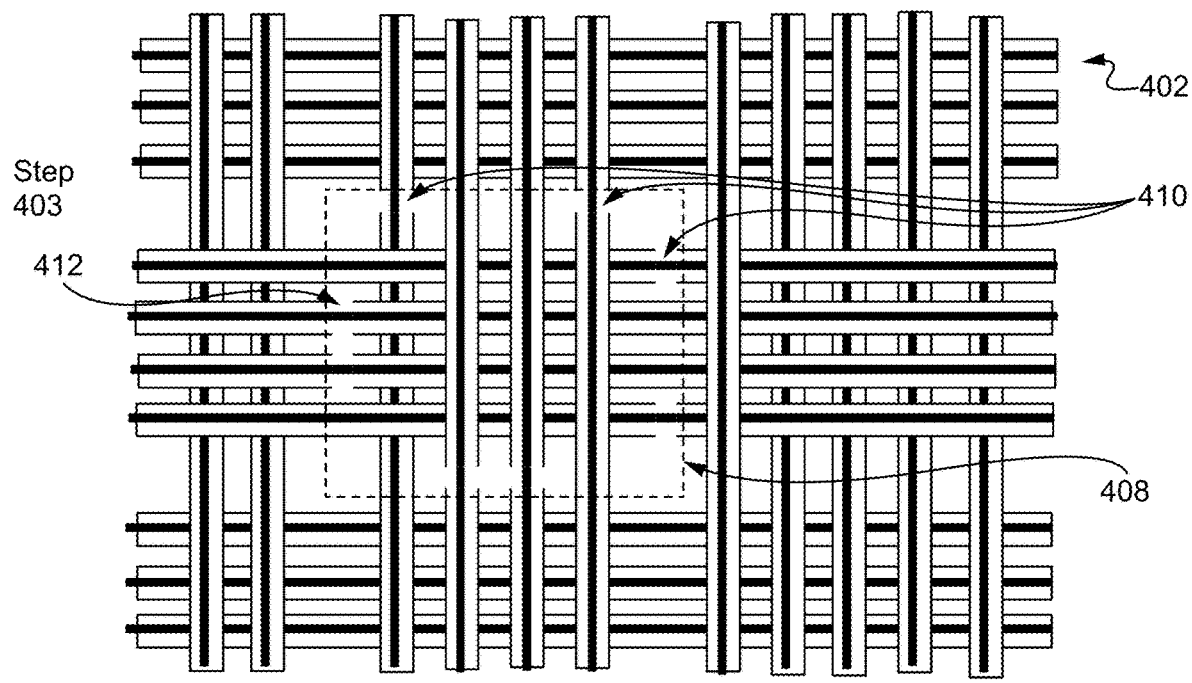
Figure 4C:
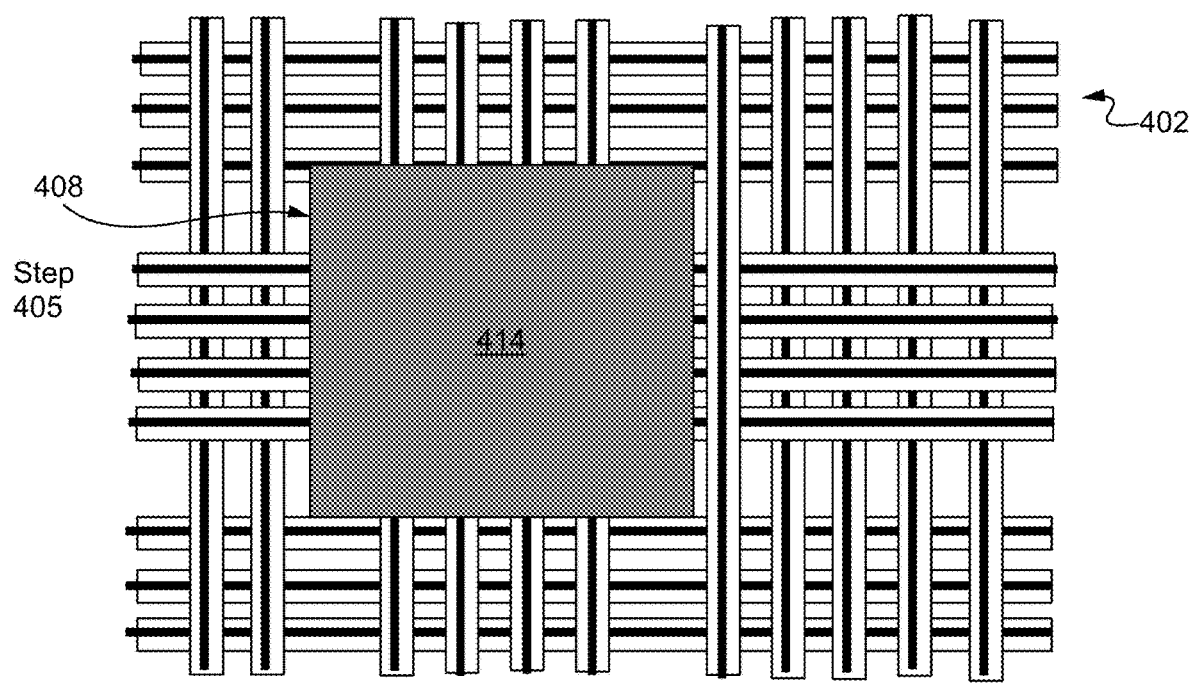

At Step 405 (FIG. 4C), a component 414 (such as, IC chip) is attached on the metal woven mesh 402 at the predetermined silicon/package footprint 408. The component I/O is aligned with the exposed metal wires 412 (FIG. 4B). In some embodiments, the components comprise solder balls. Reflow is performed to solder the components to the metal wire. In some embodiments, the wires are solderable, such as copper wire coated with ENIG (electroless nickle immersion gold). In some other embodiments, the components comprise copper/gold studs. The stackup can be flipped over, use laser to solder the wires to the pads.

Figure 4D:
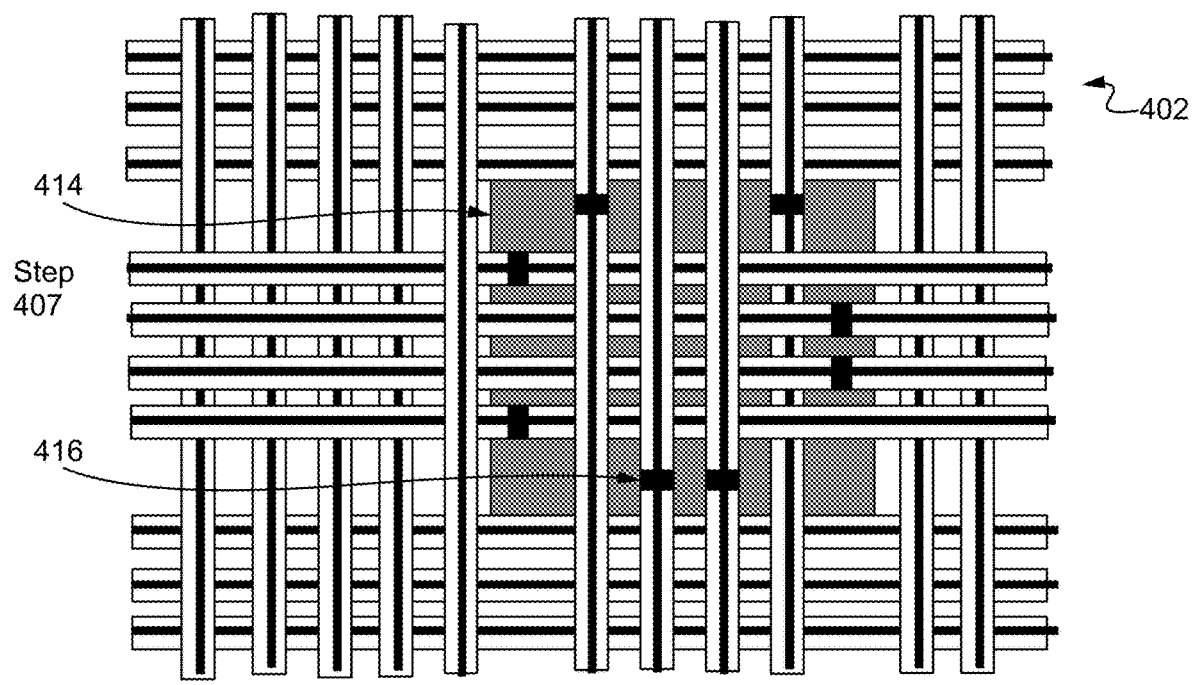

At Step 407 (FIG. 4D; a reverse side view of FIG. 4C), the interfaces of the mesh 402 and the component 414 having exposed metal wires are encapsulated with an encapsulating material (such as, epoxy) 416 to provide protection at the interconnection. A person of ordinary skill in the art appreciates that any other polymers are able to be used as the encapsulating material 416. The polymer can be cured at a curing temperature of the select polymer for a needed curing time. The FIG. 4D shows the back side of the component 414 with mesh 402.

Figure 5A:
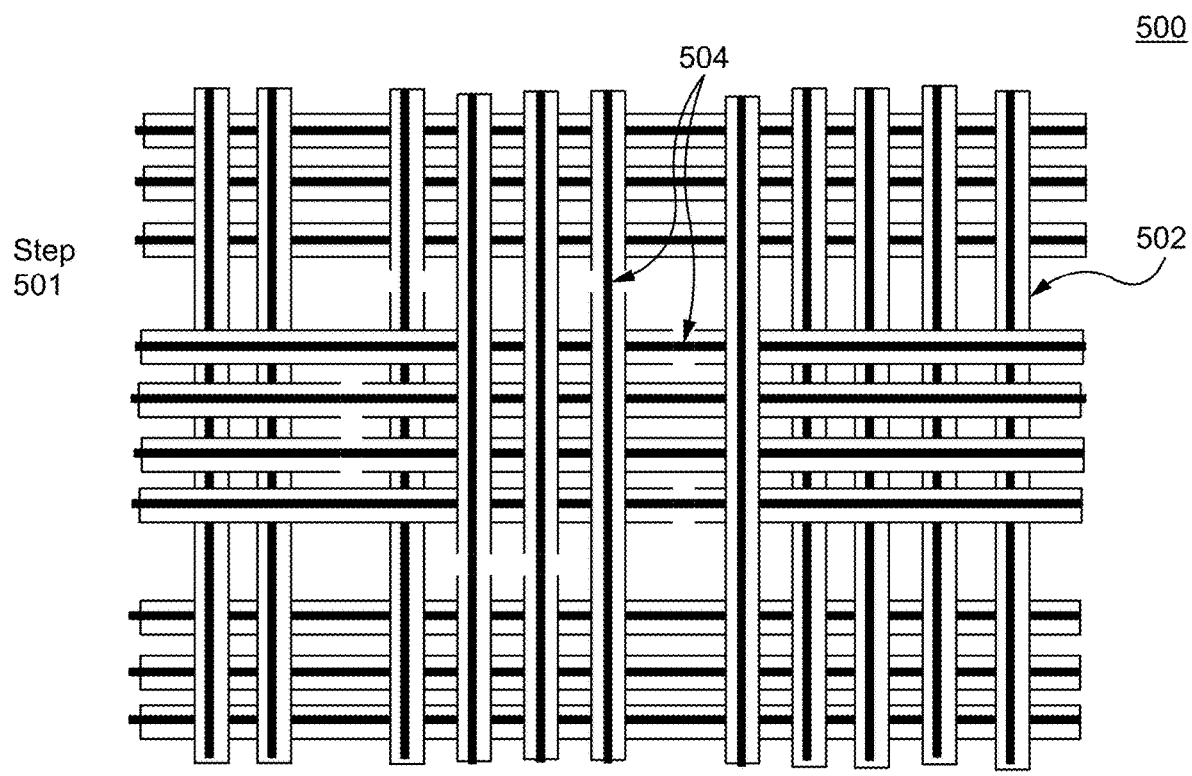
FIGS. 5A-5C illustrate another method of making a wearable device in accordance with some embodiments of the present invention.
Figure 5B:
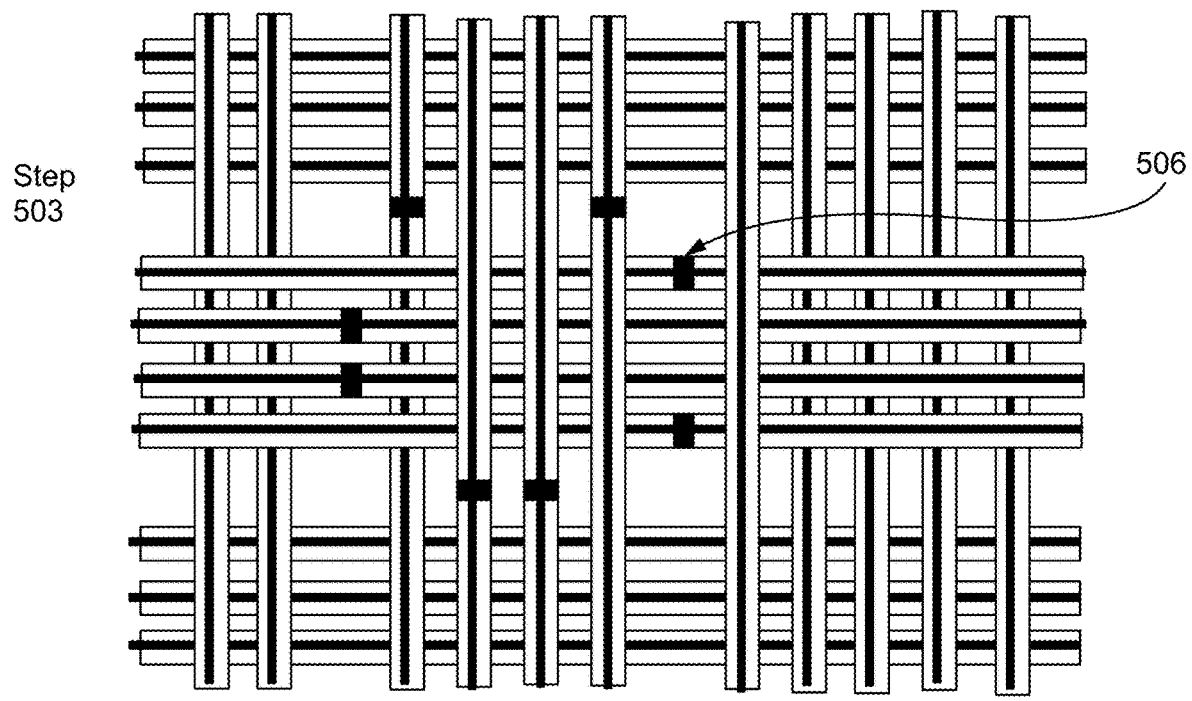
Figure 5C:
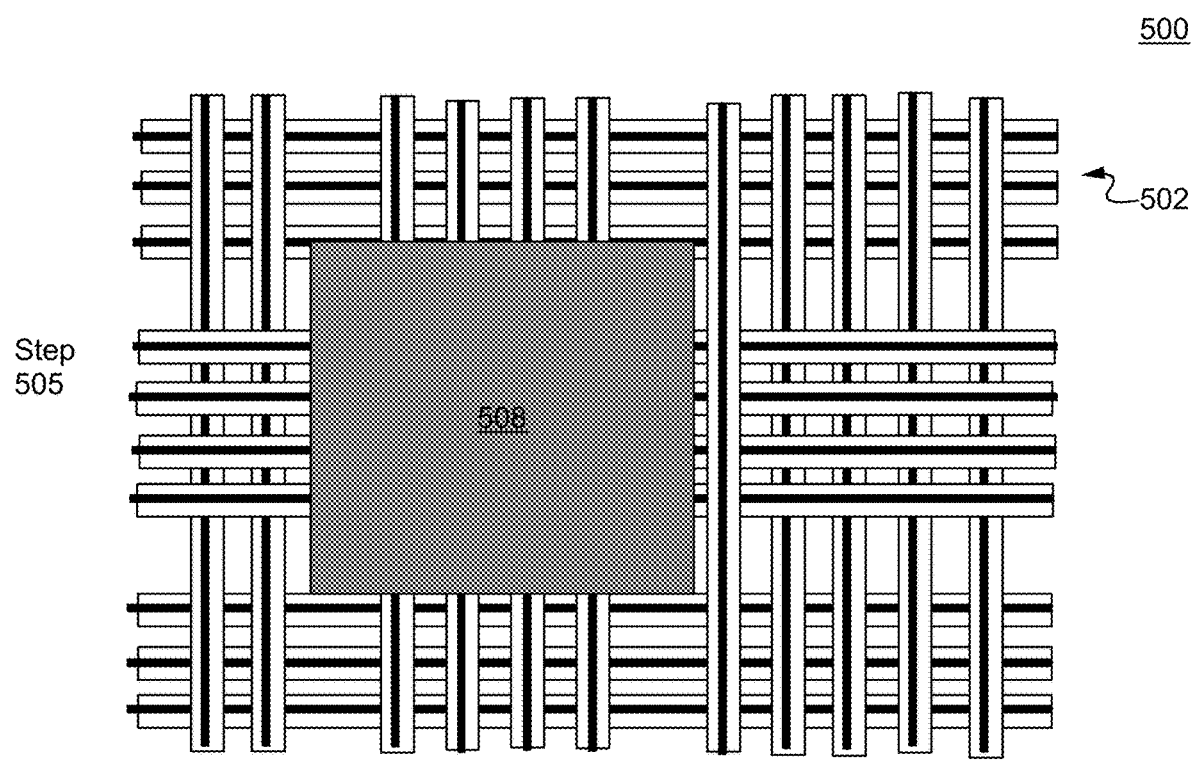

FIGS. 5A-5C illustrate another method 500 of making a wearable device in accordance with some embodiments of the present invention. Step 501 of the method 500 can use the process described in the Steps 401 and 403 of the method 400 of FIGS. 4A and 4B to make exposed wires 504 on the mesh 502. At Step 503 (FIG. 5B), electrolytic process is used to plate metals 506 at the exposed wires 504.

At Step 505 (FIG. 5C), components 508 (such as, an IC) are attached to the mesh wire 502 with component I/O (input/output) in alignment with the plated metals 506. In some embodiments, metal deposition is further performed at the interconnection between the component I/O and the plated metals 506 through electrolytic processes. In some embodiments, laser or thermocompression processes are used to bond the metal wires to the silicon pad. Similar to the process described in the method 400, polymer encapsulation can be performed to provide protection to the interconnection.

Figure 6A:
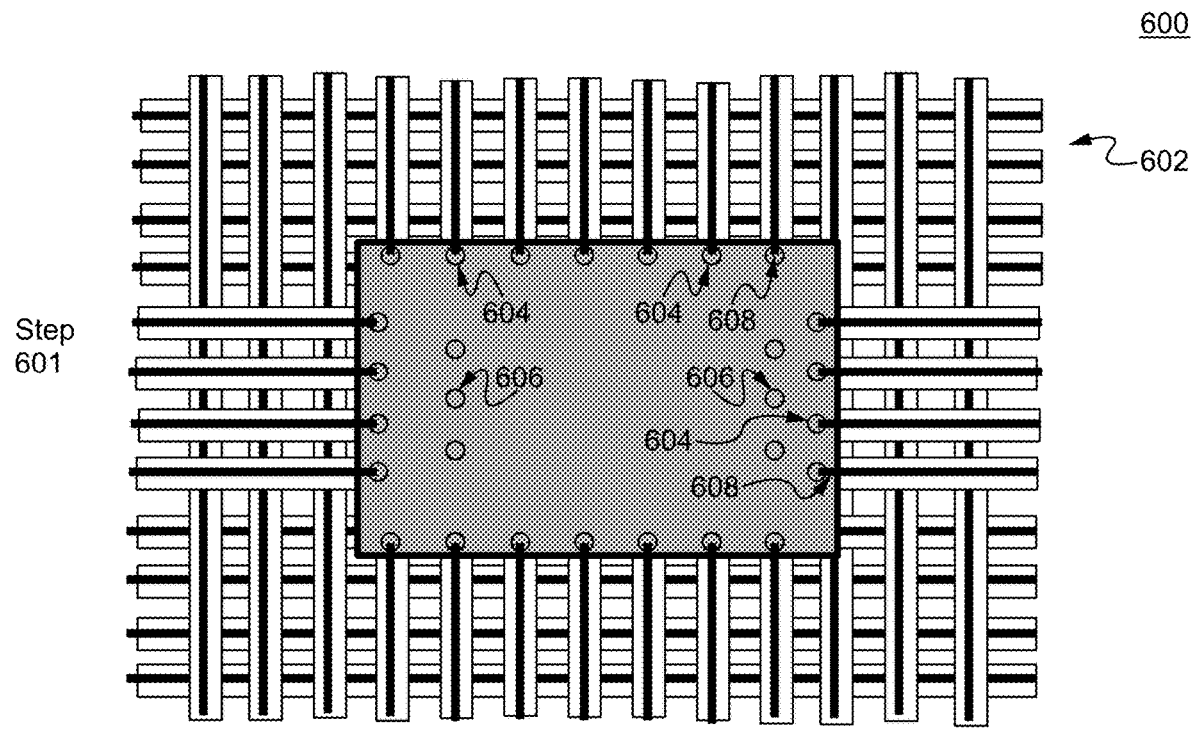
FIGS. 6A and 6B illustrate a method of making a multiple layer mesh wearable device in accordance with some embodiments of the present invention.
Figure 6B:
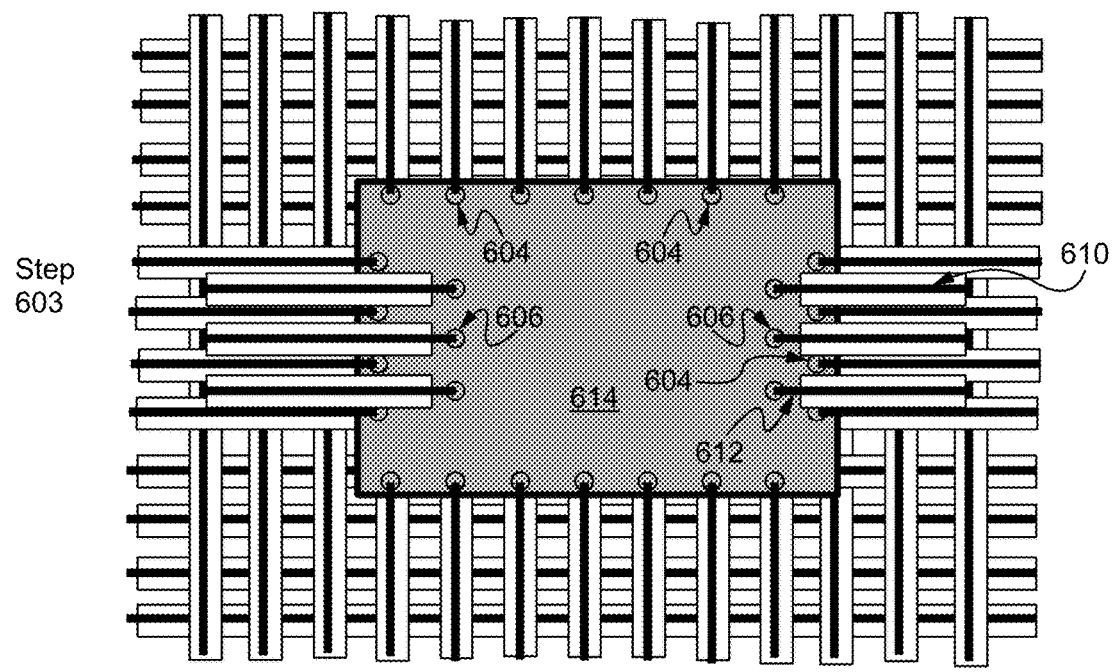

FIG. 6 illustrates a method 600 of making a multiple layer mesh wearable device in accordance with some embodiments of the present invention. In some embodiments, multiple layer meshes are used to attach the I/O at different locations. At Step 601, the first layer of mesh 602 comprises exposed wires 608 attached/soldered to the first group of I/O pads 604. The attachment of the first group of I/O pads 604 with the exposed wires 608 can be performed using the method described in the Steps 201, 203, 205, 207 and 209 of method 200 in the FIGS. 2A-2E.

At Step 603 (FIG. 6B), a second layer of the mesh 610 with a predetermined area cut-out window having exposed wires 612 is attached to the I/O 606. The attachment can be performed using laser, thermosonic, ultrasonic, or thermocompression to weld the exposed wires 612 to the the I/O 606 on the IC component 614. A person of ordinary skill in the art appreciates that any number of layers of mesh are within the scope of the present invention and different layers of the mesh can be connected to any predetermined location of the I/O on the IC components.

Figure 7:
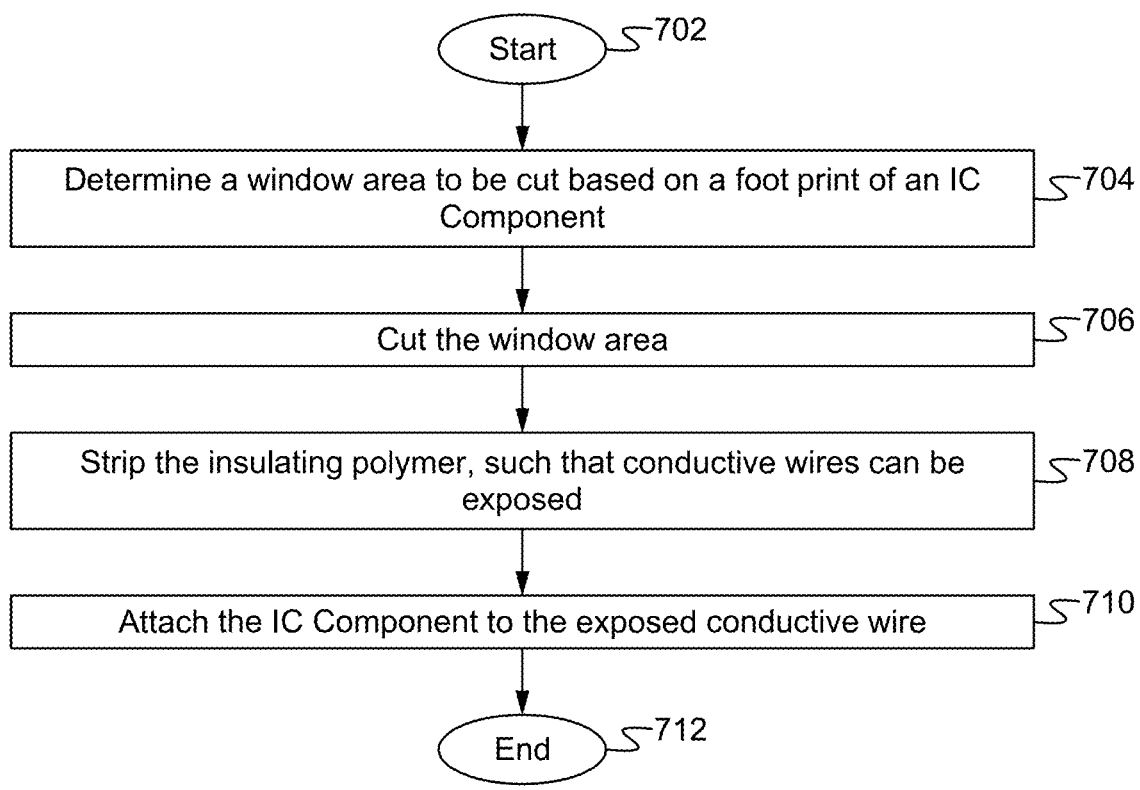
FIG. 7 is a flow chart illustrating a method of attaching an IC component to a wire mesh in accordance with some embodiments of the present invention.

FIG. 7 is a flow chart illustrating a method 700 of attaching an IC component to a wire mesh in accordance with some embodiments of the present invention. The method 700 can start from Step 702. At Step 704, a window area to be cut is determined based on a footprint of an IC component. At Step 706, the window area is cut. At Step 708, the insulating polymer is stripped, such that conductive wires are exposed. At Step 710, the IC component is attached to the exposed conductive wires. The method 700 can stop at Step 712.

The method and device can be utilized in manufacturing wearable electronic devices. For example, a heart rate monitoring IC chip can be coupled with a fabric with conductive wires contain therewithin to make a wearable cloth.

In operation, conductive wires on a mesh are exposed by cutting or stripping of insulating polymers. An IC components are attached to the exposed conductive wires.

The present invention has been described in terms of specific embodiments incorporating details to facilitate the understanding of principles of construction and operation of the invention. Such reference herein to specific embodiments and details thereof is not intended to limit the scope of the claims appended hereto. It is readily apparent to one skilled in the art that other various modifications can be made in the embodiment chosen for illustration without departing from the spirit and scope of the invention as defined by the claims.

What is claimed is:
1. A method of coupling an IC component with a polymeric insulator coated conductive mesh comprising:
   a. exposing all of conductive wires by removing a polymeric insulator coated on all of the conductive wires in a first predetermined area of a woven mesh;

b. severing a second predetermined area within the first predetermined area of the conductive wires of the polymeric insulator coated conductive mesh;
c. forming, via the severing, one or more IC component connecting ends of conductive wires between the first predetermined area and the second predetermined area; and
d. coupling an IC component with the one or more IC component connecting ends.

2. The method of claim 1, wherein the conductive mesh comprises a metal woven fabric.

3. The method of claim 1, wherein the coupling comprises soldering one of the conductive wires with an input-output terminal of the IC component.

4. The method of claim 1 further comprising determining an area to be cut on the conductive mesh according to a footprint of input-output terminals of the IC component.

5. The method of claim 4 further comprising cutting the area.

\* \* \* \* \*